(12) United States Patent
Woodard et al.

(10) Patent No.: US 7,683,797 B2
(45) Date of Patent: Mar. 23, 2010

(54) DAMAGE DETECTION/LOCATING SYSTEM PROVIDING THERMAL PROTECTION

(75) Inventors: Stanley E. Woodard, Hampton, VA (US); Thomas W. Jones, Smithfield, VA (US); Bryant D. Taylor, Smithfield, VA (US); A. Shams Qamar, Yorktown, VA (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 421 days.

(21) Appl. No.: 11/671,131

(22) Filed: Feb. 5, 2007

(65) Prior Publication Data

US 2007/0183110 A1 Aug. 9, 2007

Related U.S. Application Data

(60) Provisional application No. 60/774,802, filed on Feb. 6, 2006.

(51) Int. Cl.
*G08B 21/00* (2006.01)
*G08B 13/14* (2006.01)
*G08B 13/12* (2006.01)

(52) U.S. Cl. .............. 340/652; 340/572.1; 340/572.2; 340/572.4; 340/572.5; 340/572.7; 340/568.2

(58) Field of Classification Search .............. 340/568.2, 340/572.1–572.9, 635, 649–652, 426.1
See application file for complete search history.

(56) References Cited

U.S. PATENT DOCUMENTS

| | | | |
|---|---|---|---|
| 5,094,409 A | 3/1992 | King et al. | |
| 5,389,097 A * | 2/1995 | Bennett et al. | 606/34 |
| 5,734,323 A * | 3/1998 | Hermes et al. | 340/540 |
| 5,867,842 A | 2/1999 | Pinsley et al. | |
| 6,012,162 A | 1/2000 | Bullat | |
| 6,111,520 A * | 8/2000 | Allen et al. | 340/870.16 |
| 6,282,942 B1 | 9/2001 | Husby | |
| 6,304,169 B1 * | 10/2001 | Blama et al. | 340/10.1 |
| 6,317,048 B1 | 11/2001 | Bomya et al. | |
| 6,439,508 B1 | 8/2002 | Taylor | |
| 6,850,162 B2 * | 2/2005 | Cacioli et al. | 340/573.1 |
| 6,974,109 B1 | 12/2005 | Mezits et al. | |
| 7,017,195 B2 | 3/2006 | Buckman et al. | |
| 7,086,593 B2 * | 8/2006 | Woodard et al. | 235/449 |
| 7,159,774 B2 | 1/2007 | Woodard et al. | |
| 2003/0214408 A1 | 11/2003 | Grajales et al. | |
| 2004/0111790 A1 | 6/2004 | Dainese | |

* cited by examiner

*Primary Examiner*—Daniel Wu
*Assistant Examiner*—Mark Rushing
(74) *Attorney, Agent, or Firm*—Robin W. Edwards

(57) ABSTRACT

A damage locating system also provides thermal protection. An array of sensors substantially tiles an area of interest. Each sensor is a reflective-surface conductor having operatively coupled inductance and capacitance. A magnetic field response recorder is provided to interrogate each sensor before and after a damage condition. Changes in response are indicative of damage and a corresponding location thereof.

15 Claims, 2 Drawing Sheets

DAMAGE DETECTION/LOCATING SYSTEM PROVIDING THERMAL PROTECTION

Pursuant to 35 U.S.C. §119, the benefit of priority from provisional application 60/774,802, with a filing date of Feb. 6, 2006, is claimed for this non-provisional application.

ORIGIN OF THE INVENTION

This invention was made in part by employees of the United States Government and may be manufactured and used by or for the Government of the United States of America for governmental purposes without the payment of any royalties thereon or therefore.

BACKGROUND OF THE INVENTION

1. Field of the Invention

This invention relates to the detection and localization of damage to a material. More specifically, the invention is a system that can be used to detect and localize damage to a material while simultaneously providing thermal protection characteristics.

2. Description of the Related Art

A variety of garments and structures are made from specialty fabrics designed to withstand harsh environmental conditions. For example, the space industry fabricates space suits, space and surface habitats, airlocks, and a variety of inflatable structures from multi-layered fabrics designed to withstand a certain amount of impacts and provide thermal protection. Similarly, earth-based protective clothing (e.g., "HazMat" suits) and some earth-based temporary structures (e.g., military structures) are fabricated with damage-resistant and thermally protective multi-layer fabrics. However, all multi-layer fabrics can be damaged (e.g., penetrated, punctured, cut, torn, etc.) if the right amount of force is applied, if the fabric is breached by a sharp or pointed implement, or if the fabric receives an impact from a high velocity object such as a micrometeorite. While large damages are readily noticed, small damages can easily be unrecognizable. However, when occupant(s) of a slightly damaged structure or clothing are in a harsh environment (e.g., space, toxic gas, etc.), even small scale (i.e., unrecognized) damages to a protective structure or clothing can cause serious injury or death. Furthermore, even if only outer layers experience damage while internal layers are not damaged, it is still advantageous to identify damage to outer layers. Current damage detection methods known in the art require electrical sensors/circuits, the integrity of which must be maintained for damage detection. However, the failure probability of these circuits increases proportionally to the number of sensors used.

SUMMARY OF THE INVENTION

Accordingly, it is an object of the present invention to provide a system that can be used to detect and locate damage in or on a material.

Another object of the present invention is to provide a damage detection and localization system that can be incorporated into a fabric.

Other objects and advantages of the present invention will become more obvious hereinafter in the specification and drawings.

In accordance with the present invention, a damage locating system providing thermal protection includes an array of sensors substantially tiling an area of interest. Each sensor is defined by capacitance operatively coupled to inductance such that energy can be exchanged between the magnetic field stored via inductance and the electric field stored via capacitance. Each sensor is a reflective-surface conductor. A magnetic field response recorder is used to interrogate each sensor prior to damage thereof to establish a baseline frequency response therefore. The recorder is also used to interrogate each sensor after damage thereto. Changes from the baseline frequency response for any of the sensors are indicative of damage thereto and a corresponding location thereof.

DETAILED DESCRIPTION OF THE INVENTION

Figure 1:
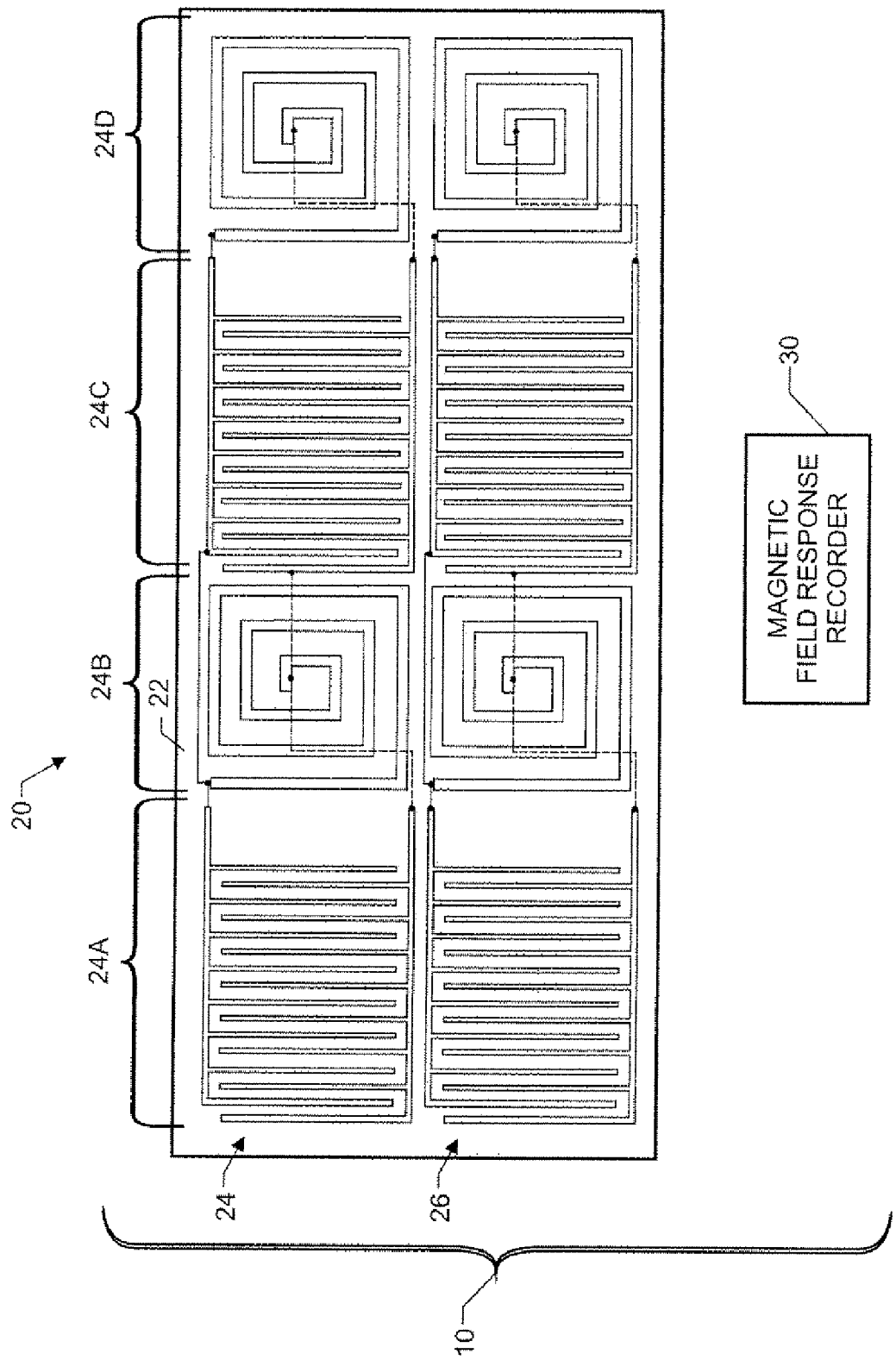
FIG. 1 is a schematic view of a system for detecting and locating damage while also providing thermal protection in accordance with the present invention.

Referring now to the drawings and more particularly to FIG. 1, a system for detecting and locating damage in accordance with an embodiment of the present invention is shown and is referenced generally by numeral 10. In general, system 10 includes a damage sensing arrangement 20 and a magnetic field response recorder 30. Damage sensing arrangement 20 will typically be incorporated into a multi-layer fabric (i.e., as one of the fabric's layers) that will be used in the fabrication of some type of protective clothing or protective structure. It is to be understood that the particular type of fabric, clothing, and/or structure incorporating damage sensing arrangement 20 are not limitations of the present invention. Furthermore, as will be explained further below, when damage sensing arrangement 20 is constructed in accordance with the teachings provided herein, damage sensing arrangement 20 also provides thermal protection.

Damage sensing arrangement 20 can include a substrate material 22 that is typically electrically non-conductive and flexible. Substrate material 22 could also be a non-conductive material or structure that is to be monitored for damage. The particular choice of substrate material 22 will vary depending on the ultimate application incorporating damage sensing arrangement 20. Accordingly, the choice of substrate material 22 is not a limitation of the present invention.

Deposited on substrate material 22 are one or more series or chains of electrically-conductive runs or traces, each of which defines an electrical circuit. Techniques used to deposit the metal conductor can be any conventional metal deposition process to include thin-film fabrication techniques. In the illustrated embodiment, two such chains or electrical circuits are shown. However, as will become evident from the description, a single chain/electrical circuit or more than two thereof could be used without departing from the scope of the present invention. Regardless of how many chains are used, they are laid out to substantially cover or tile an area of interest, i.e., an area that is to be monitored for damage.

Referring now specifically to the illustrated embodiment, first and second separate electrical circuits 24 and 26 are shown. For simplicity of illustration, circuits 24 and 26 are identically constructed so that only circuit 24 will be described in further detail. However, the present invention is not so limited as each circuit could be constructed differently to provide different response characteristics depending on the requirements of a particular application.

Figure 2:
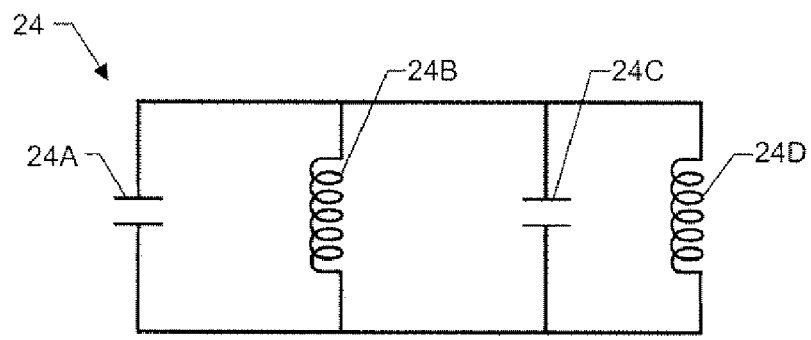
FIG. 2 is an electrical circuit equivalent of one of the damage detection/localization chains illustrated in FIG. 1.

The electrically-conductive material forming each circuit defines an alternating arrangement of capacitors and inductors that are connected in parallel. In the illustrated embodiment, circuit 24 is defined by a capacitor portion 24A, an inductor portion 24B, a capacitor portion 24C, and an inductor portion 24D. Single solid or single dashed lines are used to indicate electrical connections between adjoining capacitor and inductor portions. Actual connections between these electrical connections and an inductor or capacitor portion are indicated by solid "dots". The resulting electrical circuit equivalent is shown in FIG. 2.

To provide thermal protection, circuits 24 and 26 should be made from a reflective material or coated with a reflective material. For example, as is known in the art, excellent reflectivity can be achieved by depositing the circuit traces in a way that they are convex in cross-section, heating the traces, and then depositing a very thin layer of aluminum or silver on the circuit traces. The circuit traces on their non-conductive substrate material would essentially take the place of a conventional insulation system (e.g., a continuous metal layer deposited on a layer of insulative material). Then, in use, the reflective material would face the environment from which thermal protection is sought. Since the area of interest is substantially tiled by circuits 24 and 26, a reflective form of circuits 24 and 26 can provide substantial thermal protection.

Each capacitor portion 24A and 24C is created by inter-digitated electrodes, and each inductor portion 24B and 24D is created by a spiral run or trace. Each adjoining capacitor portion and inductor portion (connected in parallel) of a circuit defines a magnetic field response sensor. In the presence of an oscillating magnetic field, each such sensor electrically oscillates at a resonant frequency that is dependent upon the capacitance and inductance of the particular capacitor portion and inductor portion, respectively. This oscillation occurs as the energy is harmonically transferred between the inductor (as magnetic energy) and capacitor (as electrical energy). In the present invention, each adjoining capacitor-inductor is designed/constructed to resonate over a unique frequency band.

Figure 3:
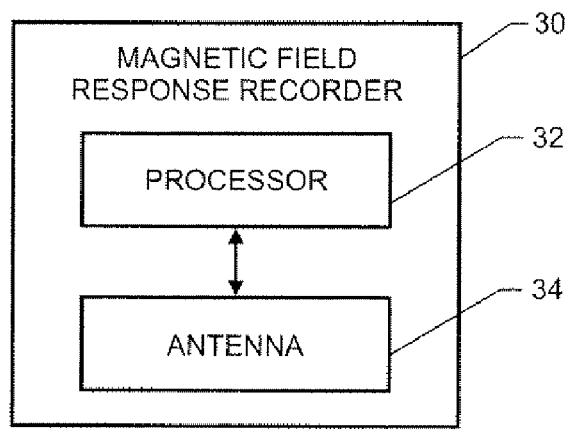
FIG. 3 is a schematic view of an embodiment of a magnetic field response recorder used in the present invention.

The application of the magnetic field to the inductor portions of damage sensing arrangement 20 as well as the reading of the induced resonant frequencies is accomplished by magnetic field response recorder 30. The operating principles and construction details of recorder 30 are provided in U.S. Pat. Nos. 7,086,593 and 7,159,774, the contents of which are hereby incorporated by reference. Briefly, as shown in FIG. 3, magnetic field response recorder 30 includes a processor 32 and a broadband radio frequency (RE) antenna 34 capable of transmitting and receiving RF energy. Processor 32 includes algorithms embodied in software for controlling antenna 34 and for analyzing the RF signals received from the magnetic field response sensors defined by damage sensing arrangement 20. On the transmission side, processor 32 modulates an input signal that is then supplied to antenna 34 so that antenna 34 produces either a broadband time-varying magnetic field or a single harmonic field. On the reception side, antenna 34 receives harmonic magnetic responses produced by damage sensing arrangement 20. Antenna 34 can be realized by two separate antennas or a single antenna that is switched between transmission and reception.

In terms of damage detection and localization, the circuits of damage sensing arrangement 20 must be interrogated by magnetic field response recorder 30. Such interrogation must first be done to establish a baseline or calibration response when the circuits are undamaged. This will typically be done when damage sensing arrangement 20 is incorporated into a fabric (not shown) that, in turn, has been used to fabricate clothing or a structure. With the baseline response established, damage sensing arrangement 20 can then be interrogated by recorder 30 on a continual, periodic, or on-demand basis to see if any damage has occurred.

Since each capacitor-inductor pair has a unique frequency response, the entire sensing arrangement 20 can be interrogated at the same time using a broadband time-varying magnetic field. If a damage (e.g., cut, break, etc.) occurs in some part of circuits 24 or 26, the electrical circuit will be broken and a "pre-damage" single capacitor-inductor pair essentially becomes two "post-damage" capacitor-inductor pairs that will resonate differently than before the damage. For example, if a break occurred in capacitor portion 24C, one capacitor-inductor pair is formed by inductor portion 24B and the portion of capacitor portion 24C that is still electrically coupled thereto. The other capacitor-inductor pair is formed by inductor portion 24D and the portion of capacitor portion 24C still electrically coupled thereto. Since the location of the pre-damaged capacitor-inductor pair and its pre-damaged baseline frequency response are already known, the change in the frequency response resulting from the damage is indicative of the damage location. In addition, once a damage has been detected, the present invention can be used to establish new baseline resonant frequencies which could be used to detect subsequent damage. Location of damage can be determined by identifying the location of the highest frequency shift. Another method of identifying the damage location is to determine where the largest difference exists between a baseline frequency response and the present response.

The advantages of the present invention are numerous. Damages to fabric-based protective clothing or structures can be readily detected even when the damages are extremely small. The wireless nature of the system eliminates the need for cumbersome electrical connections or electrical arcing problems associated therewith. The system can simultaneously provide a level of thermal protection. If multiple layers of the damage sensing arrangement are used and the circuit traces from adjacent layers are positioned to be out of registration with one another, the thermal protection properties provided by the present invention are further enhanced over a single-layer damage sensing arrangement.

Figure 4:
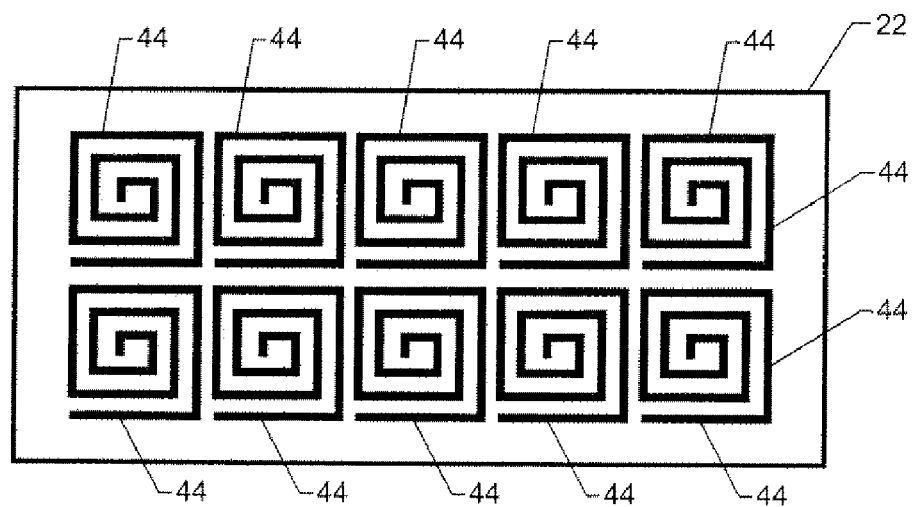
FIG. 4 is a schematic view of another embodiment of a damage sensing arrangement in accordance with the present invention.

Although the invention has been described relative to a specific embodiment thereof, there are numerous variations and modifications that will be readily apparent to those skilled in the art in light of the above teachings. For example, the damage sensing arrangement of the present invention could also be realized by tiling a non-conductive substrate material with open-circuit electrically-conductive spiral-trace sensors, the details of which are disclosed in the co-pending application entitled "WIRELESS SENSING SYSTEM USING OPEN-CIRCUIT, ELECTRICALLY-CONDUCTIVE SPIRAL-TRACE SENSOR" (Ser. No. 11/671,089), the contents of which are hereby incorporated by reference. One such damage sensing arrangement is shown in FIG. 4 where substrate material 22 is tiled with an array of open-circuit spiral trace sensors 44. Each spiral trace sensor 44 is constructed to have inductance and capacitance characteristics necessary to generate a detectable response harmonic when interrogated by the magnetic field response recorder described above. In this way, each inductor 44 resembles an inductor and capacitor electrically coupled to one another in parallel. It is therefore to be understood that, within the scope of the appended claims, the invention may be practiced other than as specifically described.

What is claimed as new and desired to be secured by Letters Patent of the United States is:

1. A damage locating system providing thermal protection, comprising:
   at least one chain substantially tiling an area that is to provide thermal protection, each said chain defined by an alternating arrangement of capacitors and inductors connected in parallel, each of said capacitors being an interdigitated-electrodes capacitor having a reflective surface associated therewith and each of said inductors being a spiral inductor having a reflective surface associated therewith, each said reflective surface adapted to face an environment from which thermal protection is sought wherein thermal protection is provided by each said chain; and
   a magnetic field response recorder for interrogating each said chain prior to damage thereof to establish a baseline frequency response for each said chain, and for interrogating each said chain after damage thereto wherein changes from said baseline frequency response for any said chain are indicative of damage thereto and a corresponding location thereof in each said chain.

2. A damage locating system as in claim 1 wherein each said chain is fabricated as a thin film.

3. A damage locating system as in claim 1 wherein each said chain has a unique baseline frequency response.

4. A damage locating system as in claim 1 wherein, for each said chain, each of said capacitors is electrically connected in parallel to an adjoining one of said inductors to define an adjoining capacitor-inductor pair, and wherein said baseline frequency response comprises a band of frequencies with a unique portion of said band corresponding to one of said adjoining capacitor-inductor pairs.

5. A damage locating system providing thermal protection, comprising:
   a non-conductive substrate material;
   at least one electrical circuit deposited on said substrate material to substantially tile an area thereon that is to provide thermal protection, each said circuit defined by an alternating arrangement of capacitors and inductors connected in parallel, each of said capacitors being an interdigitated-electrodes capacitor having a reflective surface associated therewith and each of said inductors being a spiral inductor having a reflective surface associated therewith, each said reflective surface adapted to face an environment from which thermal protection is sought wherein thermal protection is provided by each said circuit; and
   a magnetic field response recorder for interrogating each said circuit prior to damage thereof to establish a baseline frequency response for each said circuit, and for interrogating each said circuit after damage thereto wherein changes from said baseline frequency response for any said circuit are indicative of damage thereto and a corresponding location thereof in each said circuit.

6. A damage locating system as in claim 5 wherein each said circuit is fabricated as a thin film.

7. A damage locating system as in claim 5 wherein each said circuit has a unique baseline frequency response.

8. A damage locating system as in claim 5 wherein, for each said circuit, each of said capacitors is electrically connected in parallel to an adjoining one of said inductors to define an adjoining capacitor-inductor pair, and wherein said baseline frequency response comprises a band of frequencies with a unique portion of said band corresponding to one of said adjoining capacitor-inductor pairs.

9. A damage locating system as in claim 5 wherein said substrate material is flexible.

10. A damage locating system providing thermal protection, comprising:
    a flexible, non-conductive substrate material;
    at least one electrical circuit deposited as a thin-film trace on said substrate material to substantially tile an area thereon that is to provide thermal protection, said thin-film trace having a reflective surface adapted to face an environment from which thermal protection is sought wherein thermal protection is provided by each said circuit, each said circuit defined by an alternating arrangement of capacitors and inductors connected in parallel, each of said capacitors being an interdigitated-electrodes capacitor and each of said inductors being a spiral inductor; and
    a magnetic field response recorder for interrogating each said circuit prior to damage thereof to establish a baseline frequency response for each said circuit, and for interrogating each said circuit after damage thereto wherein changes from said baseline frequency response for any said circuit are indicative of damage thereto and a corresponding location thereof in each said circuit.

11. A damage locating system as in claim 10 wherein each said circuit has a unique baseline frequency response.

12. A damage locating system as in claim 10 wherein, for each said circuit, each of said capacitors is electrically connected in parallel to an adjoining one of said inductors to define an adjoining capacitor-inductor pair, and wherein said baseline frequency response comprises a band of frequencies with a unique portion of said band corresponding to one of said adjoining capacitor-inductor pairs.

13. A damage locating system providing thermal protection, comprising:
    an array of sensors substantially tiling an area that is to provide thermal protection, each of said sensors defined by a parallel arrangement of capacitance and inductance, each of said sensors being a conductor having a reflective surface, each said reflective surface adapted to face an environment from which thermal protection is sought wherein thermal protection is provided by said array, said sensors being connected in parallel to one another to form said array wherein said capacitance and said inductance alternate throughout said array; and
    a magnetic field response recorder for interrogating each of said sensors prior to damage thereof to establish a baseline frequency response for each of said sensors, and for interrogating each of said sensors after damage thereto wherein changes from said baseline frequency response for any of said sensors are indicative of damage thereto and a corresponding location thereof in said array.

14. A damage locating system as in claim 13 wherein each of said sensors is fabricated as a thin film.

15. A damage locating system as in claim 13 wherein each of said sensors comprises an interdigitated-electrode capacitor electrically coupled to a spiral inductor.

* * * * *